United States Patent
Cho et al.

(10) Patent No.: US 9,396,954 B2
(45) Date of Patent: *Jul. 19, 2016

(54) METHOD AND APPARATUS FOR MANUFACTURING THREE-DIMENSIONAL-STRUCTURE MEMORY DEVICE

(75) Inventors: Sung Kil Cho, Gyeonggi-do (KR); Hai Won Kim, Gyeonggi-so (KR); Sang Ho Woo, Gyeonggi-do (KR); Seung Woo Shin, Gyeonggi-do (KR); Gil Sun Jang, Gyeonggi-do (KR); Wan Suk Oh, Gyeonggi-do (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 218 days.

This patent is subject to a terminal disclaimer.

(21) Appl. No.: 13/823,131

(22) PCT Filed: Oct. 6, 2011

(86) PCT No.: PCT/KR2011/007403
§ 371 (c)(1),
(2), (4) Date: Mar. 14, 2013

(87) PCT Pub. No.: WO2012/050322
PCT Pub. Date: Apr. 19, 2012

(65) Prior Publication Data
US 2013/0178066 A1     Jul. 11, 2013

(30) Foreign Application Priority Data

Oct. 14, 2010 (KR) .................. 10-2010-01000093

(51) Int. Cl.
*H01L 21/306* (2006.01)
*C23C 16/458* (2006.01)
(Continued)

(52) U.S. Cl.
CPC ...... *H01L 21/30604* (2013.01); *C23C 16/4585* (2013.01); *H01L 21/0217* (2013.01);
(Continued)

(58) Field of Classification Search
CPC ................ C23C 16/4585; H01L 21/02164; H01L 21/0217; H01L 21/02271; H01L 21/31111; H01L 27/11578; H01L 27/11582; H01L 29/66833; H01L 29/7926; H01L 21/30604; H01L 21/02126; H01L 21/02129; H01L 21/02211; H01L 21/03; G11C 16/0483
USPC ......... 257/200, 296, 314, 315, 319, 321, 324, 257/328, 331; 365/148, 185.11, 185.17, 365/185.29; 438/156, 197, 240, 259, 260, 438/262, 268, 398, 694

See application file for complete search history.

(56) References Cited

U.S. PATENT DOCUMENTS 5,217,567 A * 6/1993 Cote et al. ........................ 216/67
5,304,248 A * 4/1994 Cheng et al. ................... 118/728
(Continued)

FOREIGN PATENT DOCUMENTS

KR  10-2004-0103648 A  12/2004
KR  10-2008-0105525 A  12/2008
(Continued)

*Primary Examiner* — Duy Deo
*Assistant Examiner* — Erin Bergner
(74) *Attorney, Agent, or Firm* — Rabin & Berdo, P.C.

(57) ABSTRACT

Provided is a method of manufacturing a memory device having a 3-dimensional structure, which includes alternately stacking one or more dielectric layers and one or more sacrificial layers on a substrate, forming a through hole passing through the dielectric layers and the sacrificial layers, forming a pattern filling the through hole, forming an opening passing through the dielectric layers and the sacrificial layers, and supplying an etchant through the opening to remove the sacrificial layers. The stacking of the dielectric layers includes supplying the substrate with one or more gases selected from the group consisting of $SiH_4$, $Si_2H_6$, $Si_3H_8$, and $Si_4H_{10}$, to deposit a silicon oxide layer. The stacking of the sacrificial layers includes supplying the substrate with one or more gases selected from the group consisting of $SiH_4$, $Si_2H_6$, $Si_3H_8$, $Si_4H_{10}$, and dichloro silane ($SiCl_2H_2$), and ammonia-based gas, to deposit a silicon nitride layer.

9 Claims, 12 Drawing Sheets

(51) Int. Cl.
*H01L 21/02* (2006.01)
*H01L 21/311* (2006.01)
*H01L 27/115* (2006.01)
*H01L 29/66* (2006.01)
*H01L 29/792* (2006.01)

(52) U.S. Cl.
CPC .... *H01L21/02126* (2013.01); *H01L 21/02129* (2013.01); *H01L 21/02164* (2013.01); *H01L 21/02211* (2013.01); *H01L 21/02271* (2013.01); *H01L 21/31111* (2013.01); *H01L 27/11578* (2013.01); *H01L 27/11582* (2013.01); *H01L 29/66833* (2013.01); *H01L 29/7926* (2013.01)

(56) References Cited

U.S. PATENT DOCUMENTS

| | | | |
|---|---|---|---|
| 6,566,278 B1 * | 5/2003 | Harvey et al. | 438/778 |
| 6,777,764 B2 * | 8/2004 | Hsieh et al. | 257/411 |
| 8,148,763 B2 | 4/2012 | Kim et al. | |
| 2004/0207098 A1 * | 10/2004 | Igarashi | 257/900 |
| 2009/0121271 A1 * | 5/2009 | Son et al. | 257/315 |
| 2010/0128509 A1 | 5/2010 | Kim et al. | |
| 2010/0155818 A1 * | 6/2010 | Cho et al. | 257/324 |

FOREIGN PATENT DOCUMENTS

| | | |
|---|---|---|
| KR | 10-2010-0059655 A | 6/2010 |
| KR | 10-2010-0074543 A | 7/2010 |

* cited by examiner

METHOD AND APPARATUS FOR MANUFACTURING THREE-DIMENSIONAL-STRUCTURE MEMORY DEVICE

TECHNICAL FIELD

The present invention disclosed herein relates to a method and an apparatus for manufacturing a memory device, and more particularly, to a method and an apparatus for manufacturing a memory device having a 3-dimensional structure.

BACKGROUND ART

Although being miniaturized, electronic appliances are required to process a large amount of data. This trend requires miniaturization and high integration of a memory device in electronic appliances, and thus, memory devices having a 3-dimensional structure replacing a 2-dimensional structure have attracted much interest.

DISCLOSURE

Technical Problem

The present invention provides a method and an apparatus for manufacturing a miniaturized memory device.

The present invention also provides a method and an apparatus for efficiently manufacturing a memory device having a 3-dimensional structure.

The present invention also provides a method and an apparatus for manufacturing a memory device, which prevent deformation of a substrate due to a stress difference between thin films during deposition of the thin films.

The details of one or more embodiments are set forth in the accompanying drawings and the description below.

Technical Solution

Embodiments of the present invention provide methods of manufacturing a memory device having a 3-dimensional structure, the methods including: alternately stacking one or more dielectric layers and one or more sacrificial layers on a substrate; forming a through hole passing through the dielectric layers and the sacrificial layers; forming a pattern filling the through hole; forming an opening passing through the dielectric layers and the sacrificial layers; and supplying an etchant through the opening to remove the sacrificial layers, wherein the stacking of the dielectric layers includes supplying the substrate with one or more gases selected from the group consisting of $SiH_4$, $Si_2H_6$, $Si_3H_8$, and $Si_4H_{10}$, to deposit a silicon oxide layer, and the stacking of the sacrificial layers includes supplying the substrate with one or more gases selected from the group consisting of $SiH_4$, $Si_2H_6$, $Si_3H_8$, $Si_4H_{10}$, and dichloro silane ($SiCl_2H_2$), and ammonia-based gas, to deposit a silicon nitride layer.

In some embodiments, the dielectric layer and the sacrificial layer may have an etch selectivity with respect to the etchant, and the sacrificial layer may have an etch rate that is about 5 times to about 300 times greater than that of the dielectric layer.

In other embodiments, the etchant may include at least one selected from the group consisting of $H_3PO_4$, HF, and a buffered oxide etchant (BOE).

In still other embodiments, the stacking of the dielectric layers may include supplying ethyl-based gas, and the silicon oxide layer may include silicon carbon oxide (SiCO).

In even other embodiments, the stacking of the dielectric layers may include supplying methyl-based gas, and the silicon oxide layer may include silicon carbon oxide (SiCO).

In yet other embodiments, the ammonia-based gas may include $NH_3$.

In further embodiments, the substrate may be maintained at a temperature ranging from about 300° C. to about 790° C., and a process pressure ranging from about 10 mTorr to about 250 Torr.

In still further embodiments, the silicon oxide layer and the silicon nitride layer may be different in thickness.

In even further embodiments, the alternately stacking of the dielectric layers and the sacrificial layers may include pressing an edge of the substrate with an edge ring.

In yet further embodiments, the edge of the substrate may have a width ranging from about 0.5 mm to about 3 mm inward from a boundary of the substrate.

In much further embodiments, the edge ring may be formed of ceramic.

In other embodiments of the present invention, methods of manufacturing a memory device having a 3-dimensional structure include: alternately stacking one or more dielectric layers and one or more sacrificial layers on a substrate; forming a through hole passing through the dielectric layers and the sacrificial layers; forming a pattern filling the through hole; forming an opening passing through the dielectric layers and the sacrificial layers; and supplying an etchant through the opening to remove the sacrificial layers, wherein the stacking of the dielectric layers includes supplying the substrate with one or more gases selected from the group consisting of $SiH_4$, $Si_2H_6$, $Si_3H_8$, and $Si_4H_{10}$, to deposit a first silicon oxide layer, and the stacking of the sacrificial layers includes supplying the substrate with one or more gases selected from the group consisting of $SiH_4$, $Si_2H_6$, $Si_3H_8$, $Si_4H_{10}$, and dichloro silane ($SiCl_2H_2$), ammonia-based gas, and one or more gases selected from the group consisting of $B_2H_6$ and $PH_3$, to deposit a silicon nitride layer in which boron or phosphorus is implanted.

In still other embodiments of the present invention, apparatuses for manufacturing a memory device having a 3-dimensional structure include: a chamber in which a substrate is processed; a substrate support disposed in the chamber, supporting the substrate, and vertically moving between a release position where the substrate is allowed to be introduced to and discharged from the chamber, and a process position where the substrate is processed; and an edge ring disposed over the substrate when the substrate support is disposed in the release position, and including a pressing surface pressing an edge of the substrate placed on the substrate support when the substrate support is disposed in the process position.

The substrate support may have a ring-shaped edge surrounding the substrate, and the edge ring may include: a support disposed over the edge of the substrate support; a pressing part extending from the support toward the edge of the substrate, and including the pressing surface; a horizontal support extending from the support toward a side wall of the chamber, and placed on a top surface of a fixing protrusion disposed on the side wall of the chamber when the substrate support is disposed in the release position; and a vertical support extending downward from the support, and contacting a side surface of the fixing protrusion disposed on the side wall of the chamber when the substrate support is in the release position.

Advantageous Effects

According to the embodiments, a memory device is formed in a 3-dimensional structure to reduce the volume thereof. In addition, dielectric layers and sacrificial layers are alternately stacked on a substrate, and then, patterns such as a poly silicon thin film used as a channel of a semiconductor transistor are formed to support the dielectric layers, so that the sacrificial layers can be effectively removed. In addition, when thin films are deposited, deformation of a substrate due to a stress difference between the thin films can be prevented.

DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

BEST MODE

Figure 1:
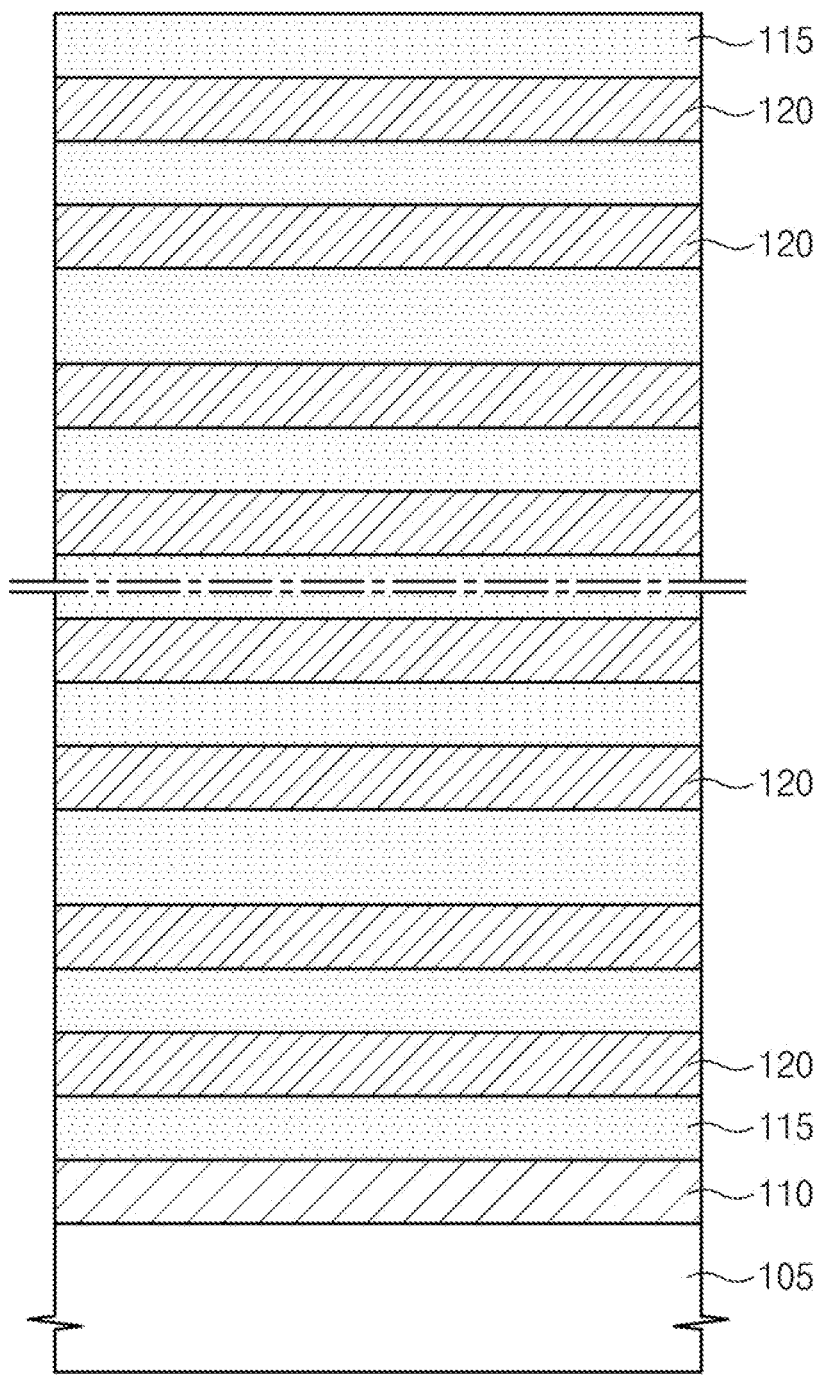
FIGS. 1 to 6 are cross-sectional views illustrating a method of manufacturing a memory device according to an embodiment of the present invention.

Preferred embodiments of the present invention will be described below in more detail with reference to FIGS. 1 to 12. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the dimensions of elements may be exaggerated for clarity of illustration.

FIGS. 1 to 6 are cross-sectional views illustrating a method of manufacturing a memory device according to an embodiment of the present invention. Hereinafter, a method of manufacturing a memory device will now be described with reference to FIGS. 1 to 6.

Referring to FIG. 1, a substrate 105 may be provided. The substrate 105 may include a semiconductor material such as a group IV semiconductor, a group III-V compound semiconductor, or a group II-VI oxide semiconductor. For example, the group IV semiconductor may include silicon, germanium, or silicon-germanium. The substrate 105 may be provided in the form of a bulk wafer or an epitaxial layer.

Impurities may be implanted in the upper portion of the substrate 105 to define an impurity region 110. Then, dielectric layers 115 and sacrificial layers 120 may be alternately stacked on the substrate 105. The dielectric layers 115 and the sacrificial layers 120 may constitute a multi layer of 8×8, 18×18, or n×n. In the current embodiment, the dielectric layer 115 is formed first, and then, the sacrificial layer 120 is formed. However, the sacrificial layer 120 may be formed first, and then, the dielectric layer 115 may be formed.

The dielectric layers 115 may be formed of silicon dioxide ($SiO_2$) that may be formed by reacting silane ($SiH_4$) with nitrous oxide ($N_2O$) on the substrate 105. Silane ($SiH_4$) may be replaced with $Si_2H_6$, $Si_3H_8$, or $Si_4H_{10}$. The sacrificial layers 120 may be formed of silicon nitride ($Si_3NH_4$) that may be formed by reacting silane with ammonia-based gas on the substrate 105. Silane may be replaced with $Si_2H_6$, $Si_3H_8$, $Si_4H_{10}$, or dichloro silane ($SiCl_2H_2$), and ammonia-based gas may be $NH_3$. Alternatively, one or more gases selected from the group consisting of $SiH_4$, $Si_2H_6$, $Si_3H_8$, $Si_4H_{10}$, and $SiCl_2H_2$; ammonia-based gas; and one or more gases selected from the group consisting of $B_2H_6$ and $PH_3$ may be supplied on the substrate 105 to form silicon oxide that is used to form the sacrificial layers 120. In this case, boron and/or phosphorus may be implanted in silicon nitride.

Figure 2:
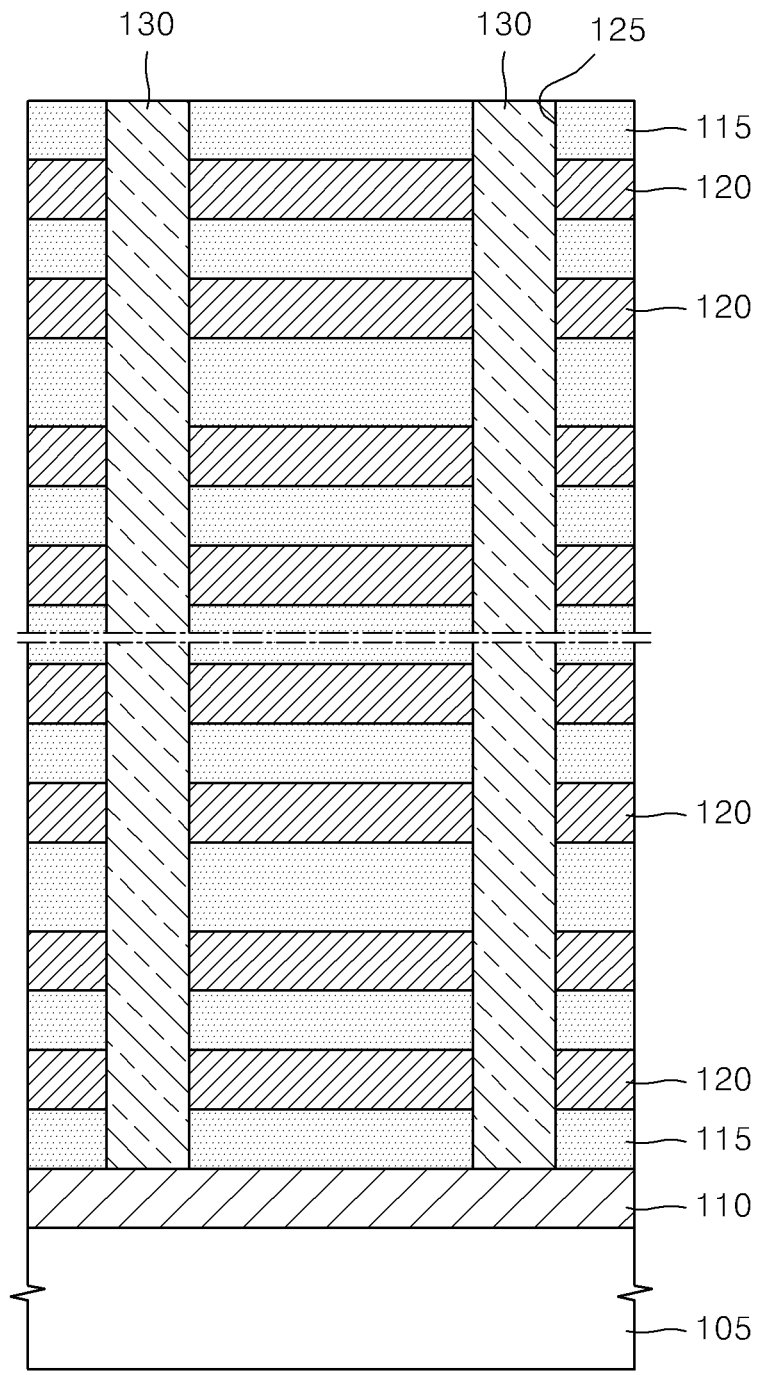

Next, referring to FIG. 2, the dielectric layers 115 and the sacrificial layers 120 may be etched to form through holes 125 that pass through the dielectric layers 115 and the sacrificial layers 120. The through holes 125 may be formed using a well-known photolithography or etching technology. Then, the through holes 125 may be filled with patterns 130 through a well-known channel forming process for forming a semiconductor transistor (or through a process of forming a poly silicon thin layer). At this point, the patterns 130 may have a hollow cylindrical shape, and pass through the dielectric layers 115 and the sacrificial layers 120. For example, the patterns 130 may have a polycrystalline structure or a thin film shape such as an epitaxial layer having a single crystalline structure.

Figure 3:
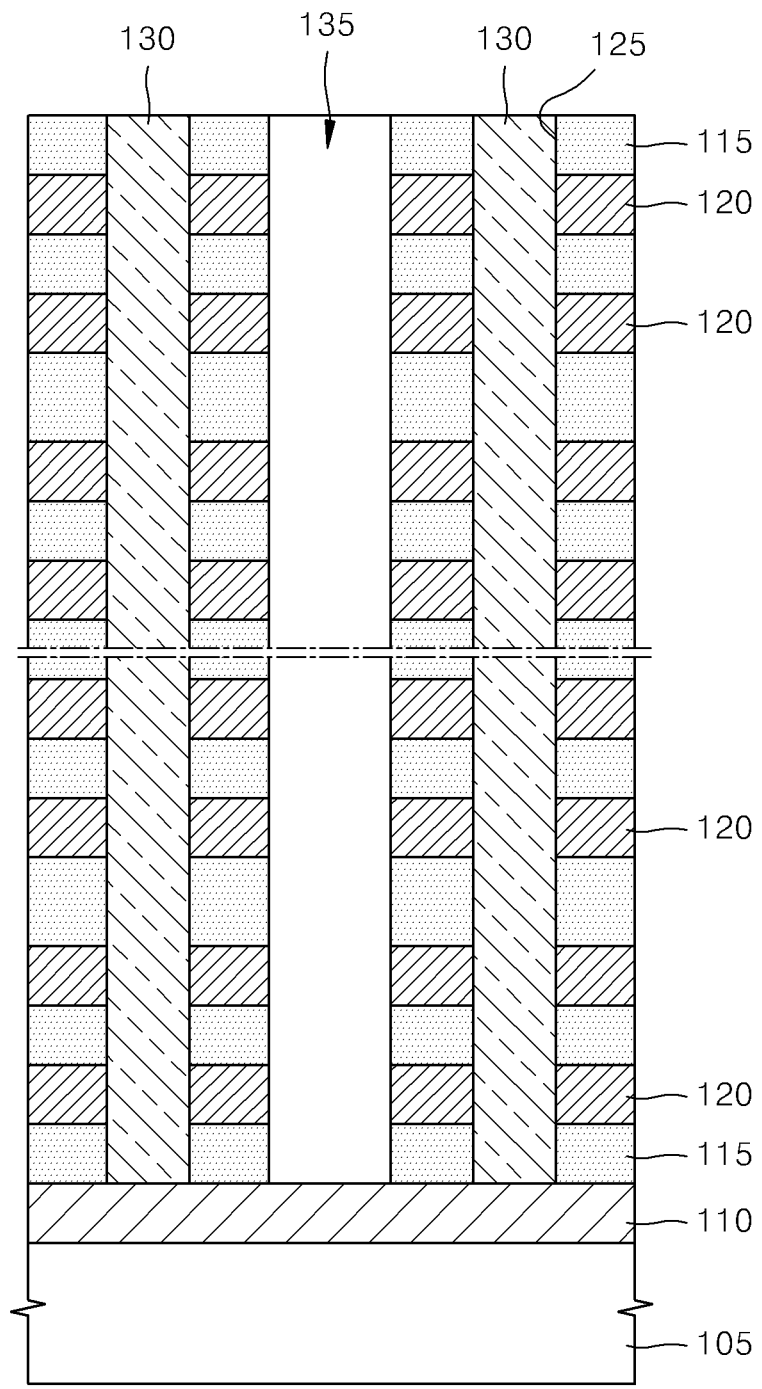

Next, referring to FIG. 3, the dielectric layers 115 and the sacrificial layers 120 between the patterns 130 may be etched to form openings 135. The openings 135 may be formed using a photolithography or etching technology.

Figure 4:
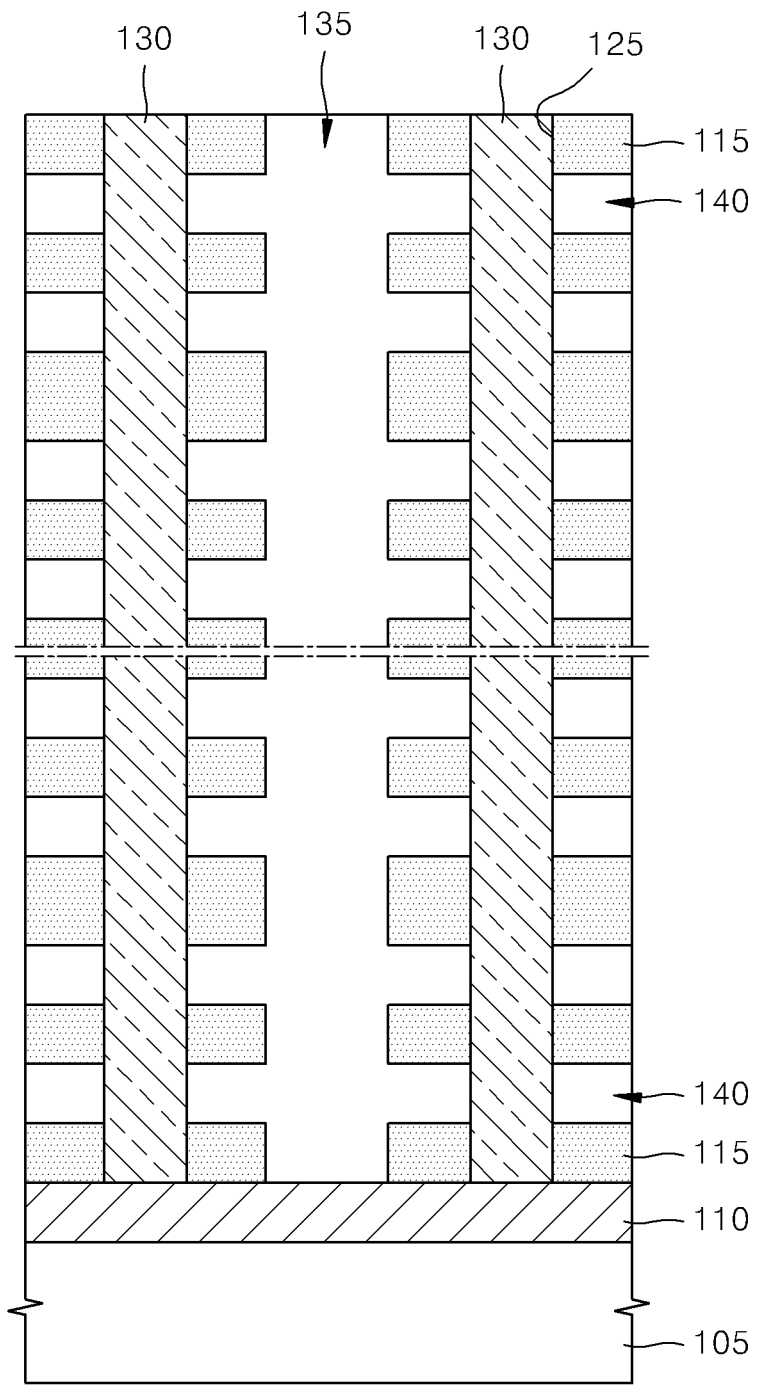

Next, referring to FIG. 4, the sacrificial layers 120 may be removed. As described above, the dielectric layers 115 may be formed of silicon oxide, and the sacrificial layers 120 may be formed of silicon nitride or silicon nitride that is formed by supplying one or more gases selected from the group consisting of $SiH_4$, $Si_2H_6$, $Si_3H_8$, $Si_4H_{10}$, and dichloro silane ($SiCl_2H_2$) and one or more gases selected from the group consisting of $B_2H_6$ and $PH_3$, and implanting boron and/or phosphorus in the silicon nitride. The sacrificial layer 120 and the dielectric layer 115 have an etch selectivity, and the sacrificial layer 120 may have an etch rate that is about 5 times to about 300 times greater than that of the dielectric layer 115. Thus, when the dielectric layers 115 and the sacrificial layers 120 are exposed to an etchant for the same time, an etched amount of the sacrificial layers 120 may be about 5 times to about 300 times greater than that of the dielectric layers 115, and the etched amount of the dielectric layers 115 is very small.

Accordingly, the sacrificial layers 120 may be removed. Isotropic etch may be used to introduce an etchant between the dielectric layers 115 through the openings 135, and include wet etch or chemical dry etch. The etchant may include any one selected from the group consisting of $H_3PO_4$, HF, and a buffered oxide etchant (BOE). Accordingly, the sacrificial layers 120 are removed between the dielectric layers 115 to form tunnels 140 connected to the openings 135. The tunnels 140 may expose side walls of the patterns 130.

Figure 5:
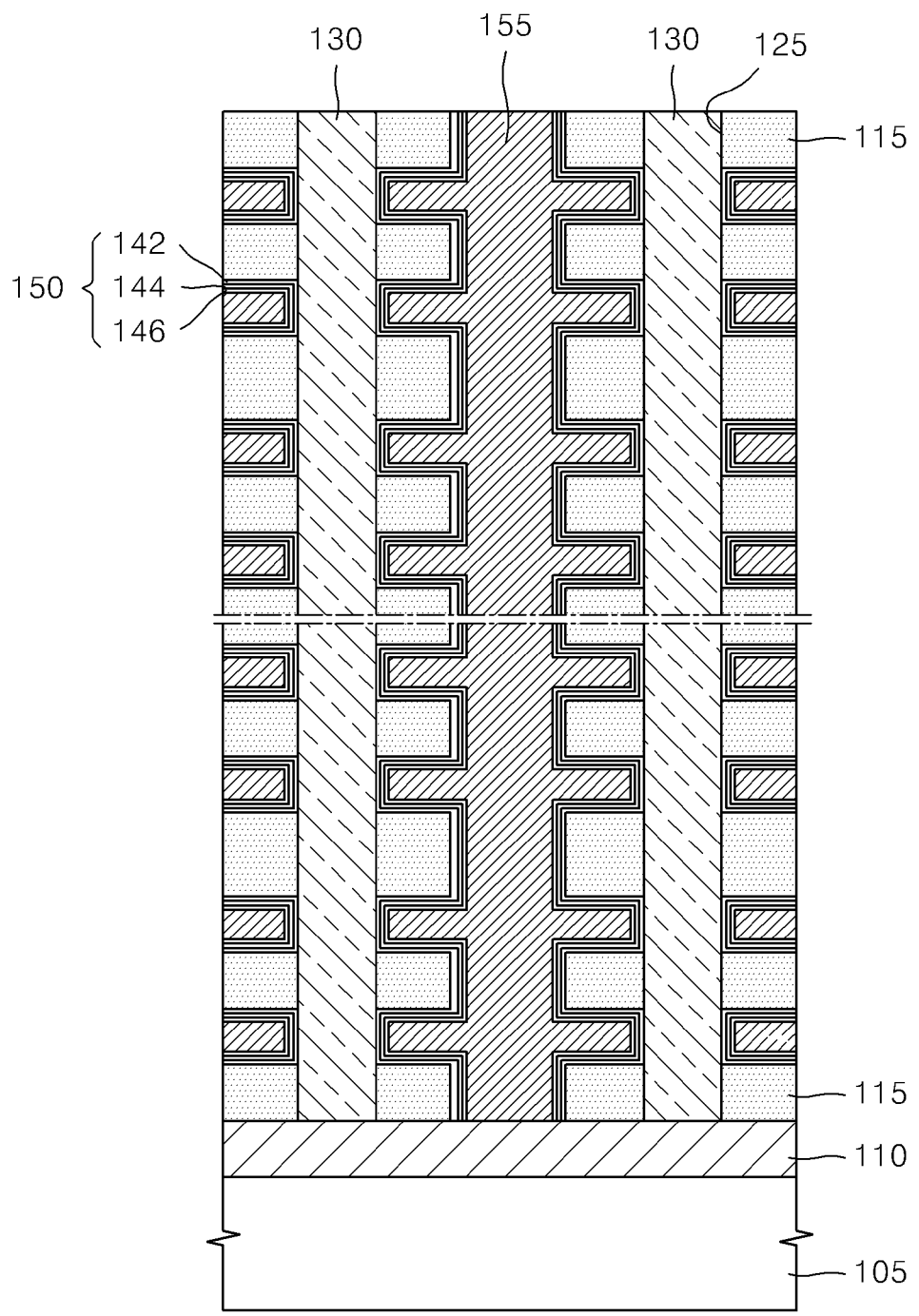

Next, referring to FIG. 5, storage media 150 may be formed on side walls of the dielectric layers 115 and the patterns 130 exposed by the openings 135 (refer to FIG. 4) and the tunnels 140 (refer to FIG. 4). The storage media 150 may be formed by sequentially forming a tunneling dielectric layer 142, a charge storage layer 144, and a blocking dielectric layer 146. Then, a conductive layer 155 may be formed on the storage media 150. For example, the storage media 150 and the conductive layer 155 may be formed using a chemical vapor deposition method or a plating method, which is efficient to coat a corner.

Figure 6:
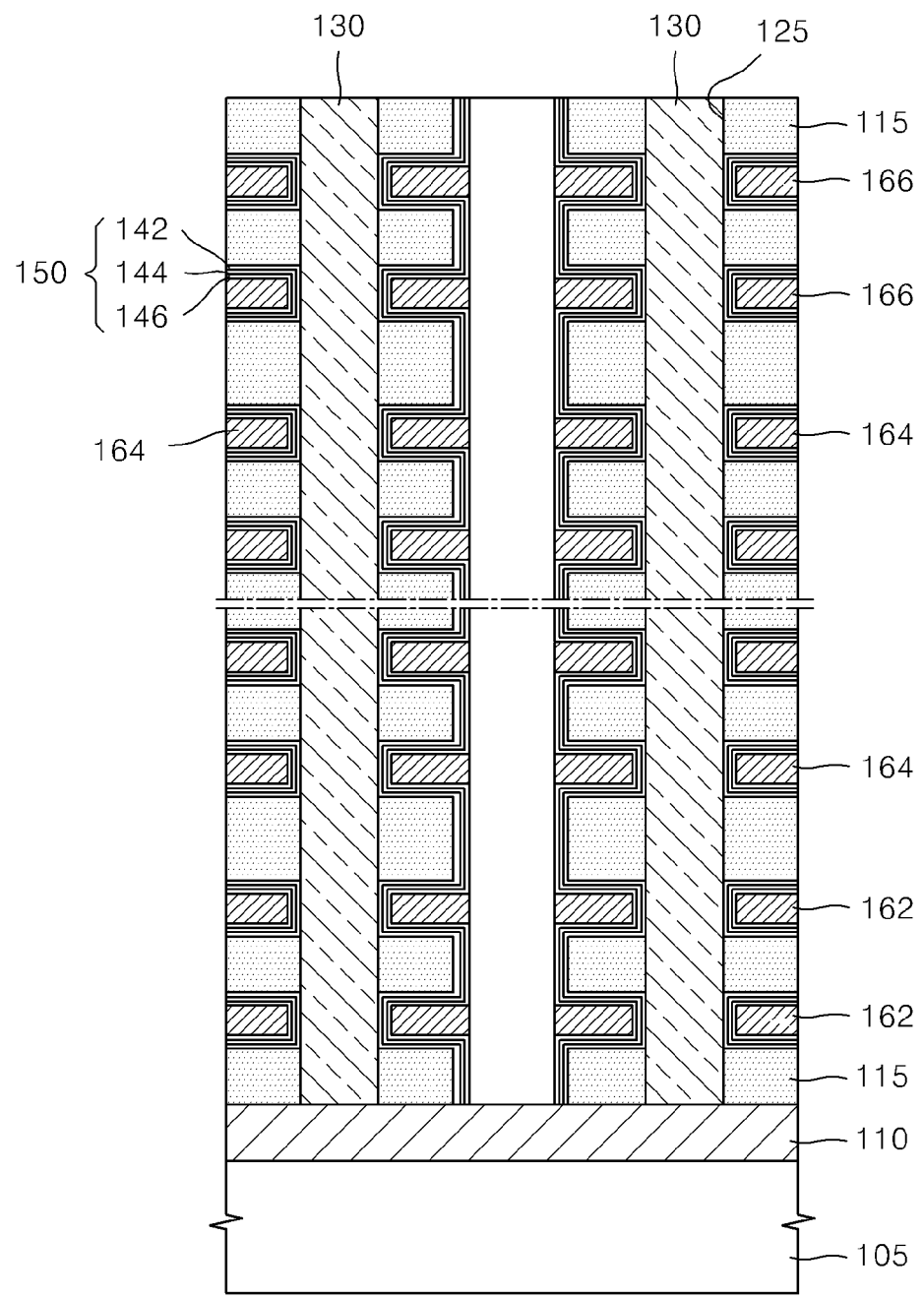

Next, referring to FIG. 6, a portion of the conductive layer 155 (refer to FIG. 5) corresponding to the openings 135 (refer to FIG. 4) may be selectively etched to form a plurality of ground selection gate electrodes 162, a plurality of control gate electrodes 164, and a plurality of string selection gate electrodes 166.

Figure 7:
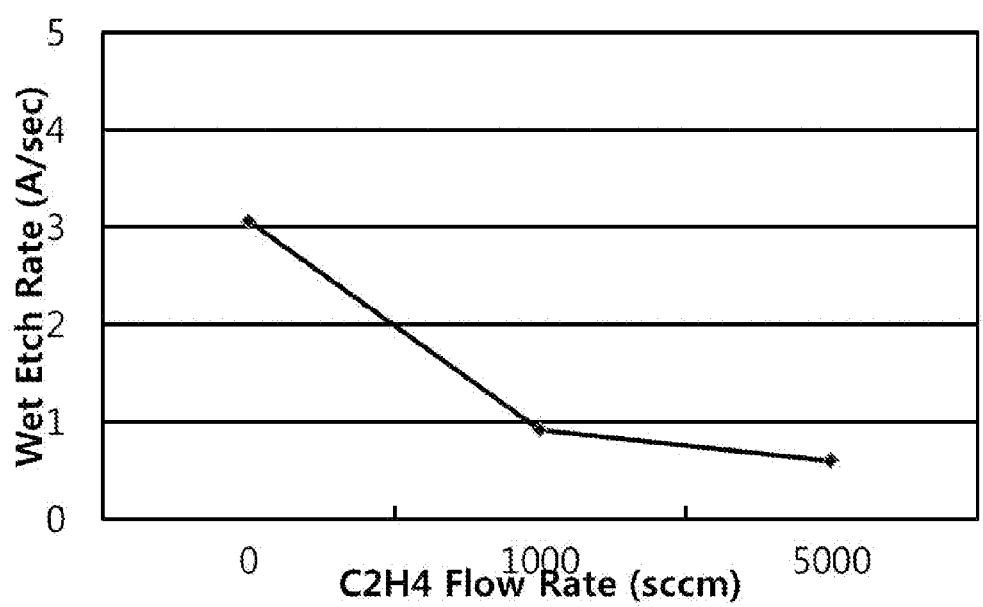
FIG. 7 is a graph illustrating an etch rate of a deposited thin film versus a supply amount of ethyl-based gas according to an embodiment of the present invention.

Alternatively, ethyl-based gas (e.g., $C_2H_4$) or methyl-based gas (e.g., $CH_3$) may be supplied together with silane ($SiH_4$), and thus, the dielectric layers 115 may be thin films of silicon carbon oxide (SiCO). In this case, an etch rate of the dielectric layers 115 is further decreased than that of the sacrificial layers 120, thus minimizing a loss of the dielectric layers 115 due to a removal of the sacrificial layers 120. FIG. 7 is a graph illustrating an etch rate of a deposited thin film versus a supply amount of ethyl-based gas according to an embodiment of the present invention. Referring to FIG. 7, as a supply amount of ethyl-based gas increases, an etch rate of a deposited thin film decreases. Accordingly, an etch selectivity of the dielectric layers 115 and the sacrificial layers 120 can be controlled.

Figure 8:
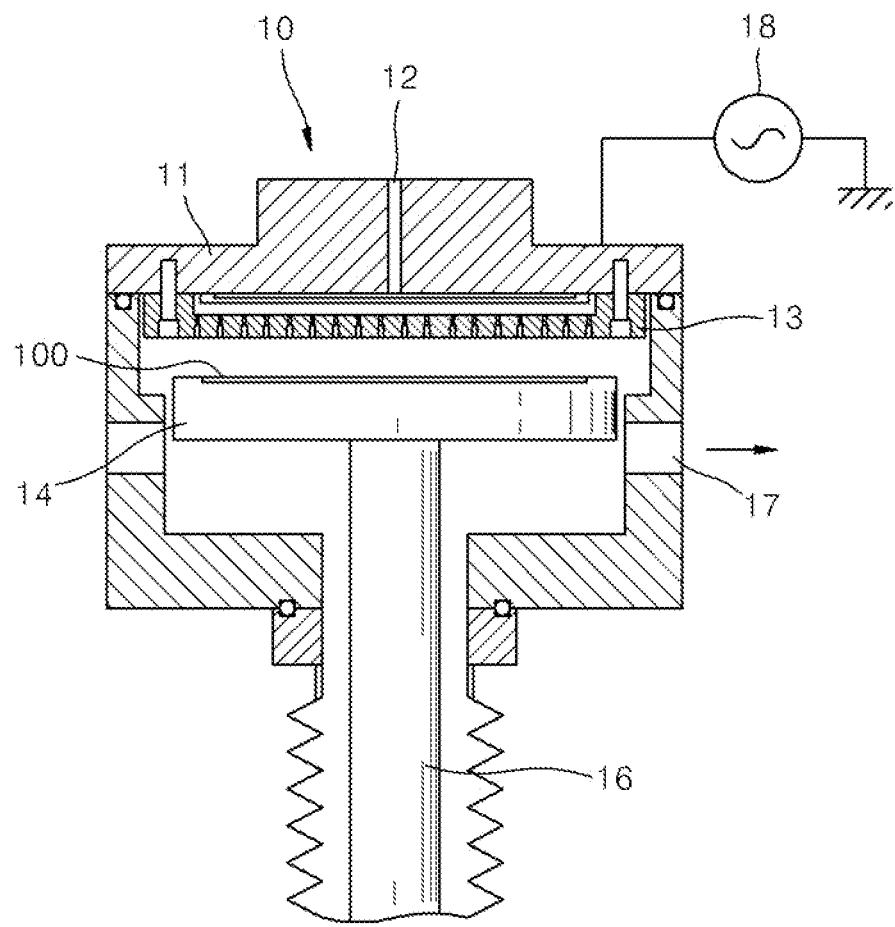
FIG. 8 is a schematic view illustrating an apparatus for manufacturing a memory device according to an embodiment of the present invention.

FIG. 8 is a schematic view illustrating an apparatus for manufacturing a memory device according to an embodiment of the present invention. Referring to FIG. 8, an apparatus 10 for manufacturing a memory device includes an introducing part 12. Source gas or reaction gas is introduced through the introducing part 12, and is injected into a chamber 11 through a shower head 13. During a process, silane gas may be supplied at about 1 sccm to about 1000 sccm, and the reaction gas (e.g., $N_2O$ or $NH_3$) may be supplied at about 100 sccm to about 50000 sccm. As described above, ethyl-based gas (e.g., $C_2H_4$) or methyl-based gas (e.g., $CH_3$) may be supplied at about 50 sccm to about 10000 sccm.

A substrate 100, which is an object of the process, is placed on a substrate support 14 that is supported by a support 16. The substrate support 14 may maintain the substrate 100 at a temperature ranging from about 300° C. to about 790° C. during the process. At this point, the inner pressure of the chamber 11 may range from about 10 mTorr to about 250 Torr. When the process is completed, the substrate 15 is discharged through a discharging part 17.

Figure 9:
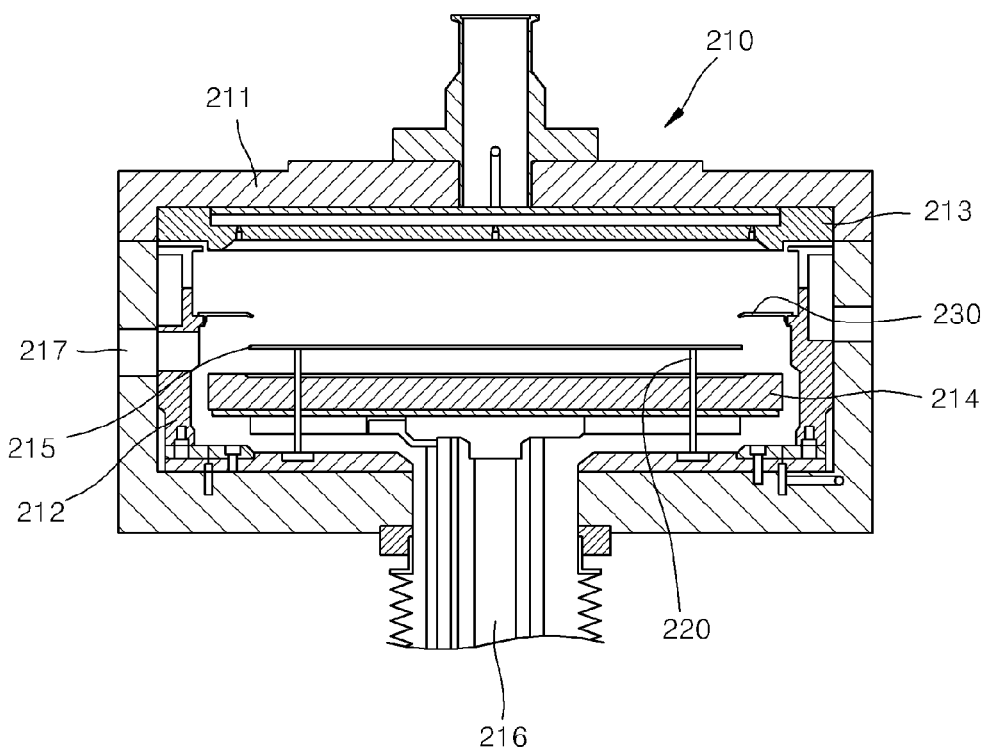
FIG. 9 is a cross-sectional view illustrating an apparatus for manufacturing a memory device according to another embodiment of the present invention.
Figure 10:
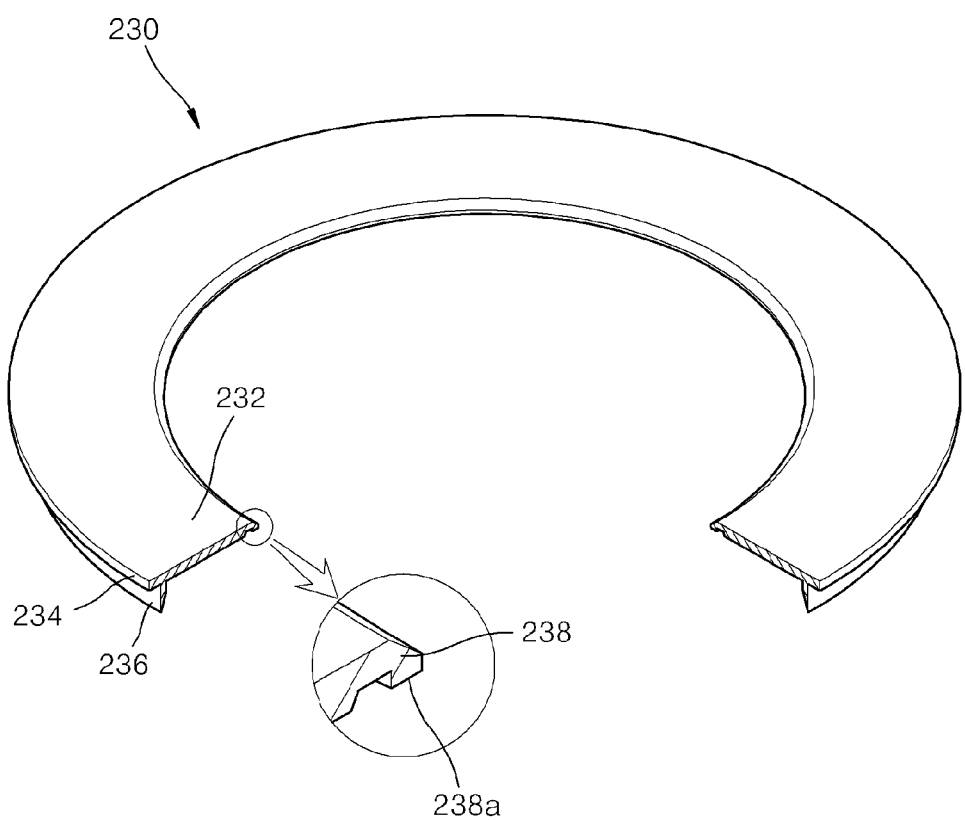
FIG. 10 is a perspective view illustrating an edge ring of FIG. 9.

FIG. 9 is a cross-sectional view illustrating an apparatus for manufacturing a memory device according to another embodiment of the present invention. FIG. 10 is a perspective view illustrating an edge ring of FIG. 9. In the current embodiment, different parts from those of the previous embodiment will be principally described, and a description of the same parts as those of the previous embodiment will be omitted.

Referring to FIG. 9, an apparatus 210 for manufacturing a memory device includes a substrate support 214 disposed in a chamber 211. The substrate support 214 is supported by a support 216. A separate driving part (not shown) vertically moves the substrate support 214 and the support 216 between a release position (refer to FIG. 9) where a substrate 215 is allowed to be introduced to and discharged from the chamber 211, and a process position (refer to FIG. 11) where the substrate 215 is processed, which will be described later.

The substrate 215 is introduced to and discharged from the chamber 211 through a discharging part 217 disposed in a side wall of the chamber 211. The substrate 215 introduced to the chamber 211 through the discharging part 217 is disposed over the substrate support 214. The substrate support 214 has a diameter greater than that of the substrate 215. The substrate 215 is disposed in the central portion of the substrate support 214. In this case, the substrate 215 is supported by lift pins 220 passing through the substrate support 214, and is spaced upward from the substrate support 214. A shower head 213 is disposed over the substrate support 214. Source gas or reaction gas is injected in to the chamber 211 through the shower head 213.

The chamber 211 includes a vacuum guide 212 and an edge ring 230. The vacuum guide 212 has a cylindrical shape, and is disposed in the chamber 211. Referring to FIG. 10, the edge ring 230 has a ring shape corresponding to an inner shape of the chamber 211, and includes a support 232, a horizontal support 234, a vertical support 236, and a pressing part 238 including a pressing surface 238a. The edge ring 230 is disposed between the substrate support 214 and the shower head 213, and is placed on a fixing protrusion 212a protruding from an inner wall of the vacuum guide 212. Referring to FIG. 9, when the substrate support 214 is disposed in the release position, the edge ring 230 is placed on the fixing protrusion 212a. When the substrate support 214 is disposed in the process position, the edge ring 230 is removed from the fixing protrusion 212a, and is placed on the substrate support 214, which will be described later.

Figure 11:
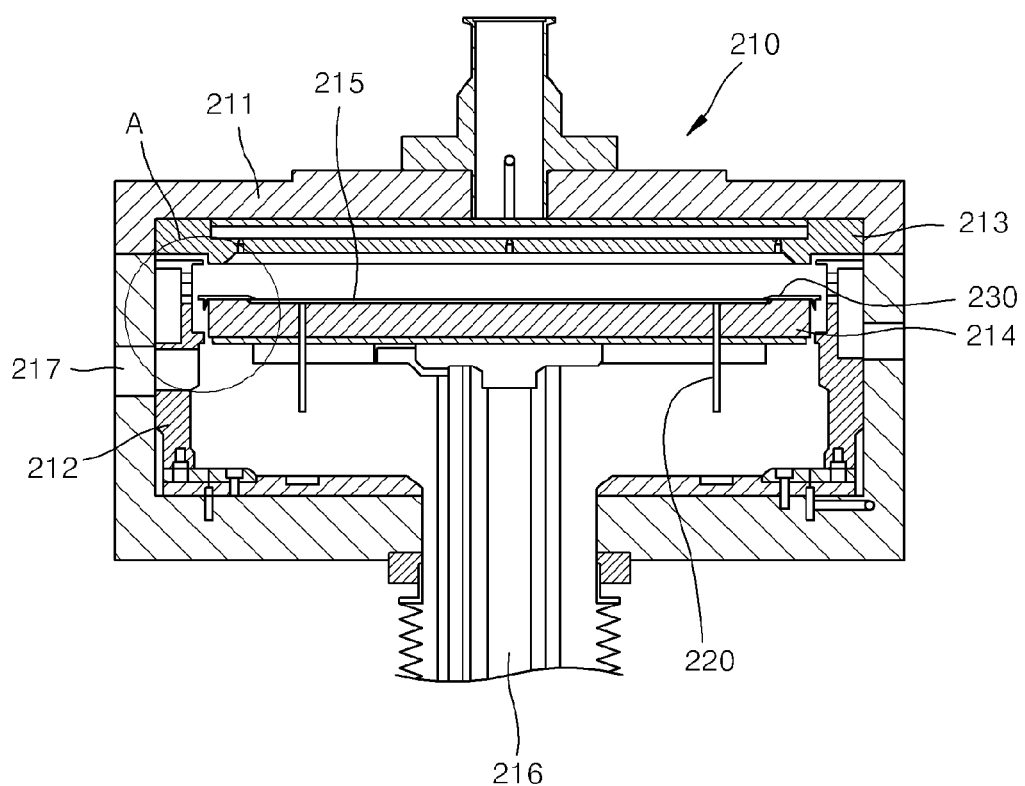
FIGS. 11 and 12 are cross-sectional views illustrating an operation of the edge ring of FIG. 9.
Figure 12:
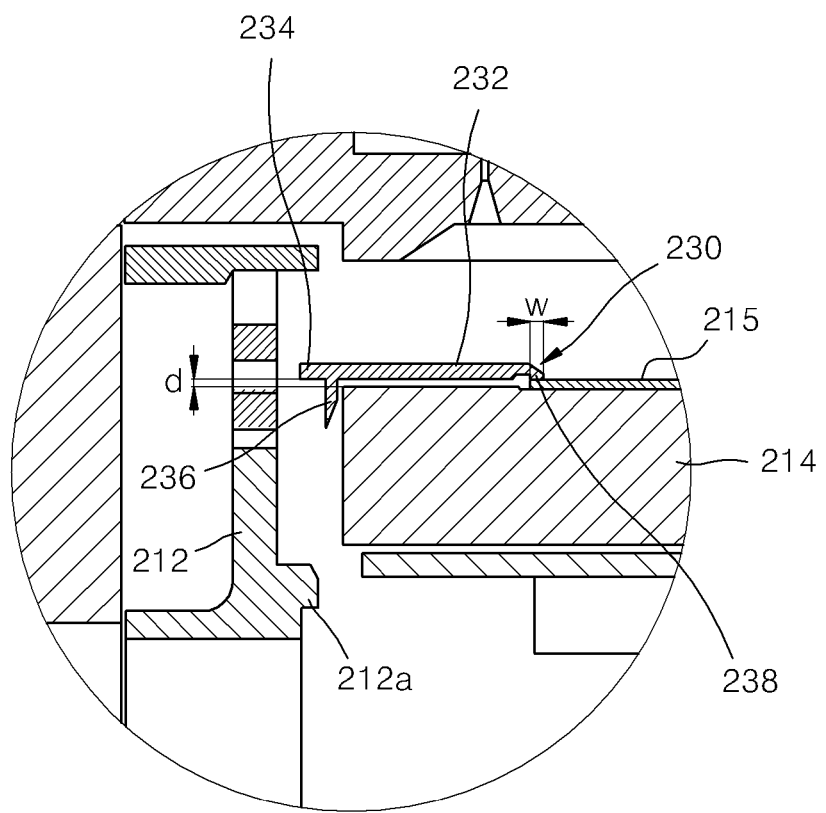

FIGS. 11 and 12 are cross-sectional views illustrating an operation of the edge ring of FIG. 9. As described above, the substrate support 214 and the support 216 are vertically moved between the release position and the process position by the driving part (not shown).

Referring to FIG. 12, the horizontal support 234 extends from the support 232 toward the side wall of the chamber 211, and the vertical support 236 extends downward from the support 232. The pressing part 238 obliquely extends downward from the support 232 toward the inside of the chamber 211.

Referring to FIG. 9, when the substrate support 214 is disposed in the release position, the edge ring 230 may be placed on the fixing protrusion 212a through the horizontal support 234 and the vertical support 236. At this point, the horizontal support 234 contacts the top surface of the fixing protrusion 212a, and the vertical support 236 contacts a side surface of the fixing protrusion 212a. In addition, the support 232 and the pressing part 238 protrude toward the inside of the chamber 211.

Referring to FIG. 11, when the substrate support 214 is moved to the process position, the substrate support 214 uses its ring-shaped edge surrounding the substrate 215, to raise and remove the edge ring 230 from the fixing protrusion 212a. At this point, referring to FIG. 12, the support 232 is adjacent to the edge of the substrate support 214, and the pressing part 238 contacts and presses the edge of the substrate 215 placed on the substrate support 214. That is, the edge ring 230 placed on the substrate support 214 uses its weight to press the edge of the substrate 215, and the pressing surface 238a of the pressing part 238 contacts the edge of the substrate 215.

When silicon oxide layers and silicon nitride layers are alternately stacked on a substrate as described in FIG. 1, a stress difference between the silicon oxide layer and the silicon nitride layer may occur during a process, thereby causing warpage of the substrate. Accordingly, an edge of the substrate may be spaced apart from a substrate support, and the central portion of the substrate may be deformed in a U shape. This affects temperature distribution in the substrate (temperature distribution between the center and edge of the substrate), thus seriously affecting process uniformity (e.g., deposition rate). In a field, after the above-described process, a deposition rate measured in the edge of a substrate is significantly lower than that measured in the central portion of the substrate. Thus, the edge of the substrate 215 may be pressed using the pressing part 238 of the edge ring 230 to prevent the edge of the substrate 215 from being spaced apart from the substrate support 214, thus, preventing deformation of the substrate 215.

Referring to FIG. 12, a width w of the edge of the substrate 215 pressed by the pressing part 238 of the edge ring 230 ranges from about 0.5 mm to about 3 mm inward from the boundary of the substrate 215. Since the area corresponding to the width w is substantially not used as a semiconductor device in a semiconductor process, the area corresponding to the width W does not affect the yield of semiconductor devices. Also, the pressing surface 238a may have the width w.

Referring to FIG. 12, the edge ring 230 may use only the pressing part 238 to press the substrate 215 against the substrate support 214, and the support 232 is spaced a distance d from the edge of the substrate support 214. In this case, since the gross weight of the edge ring 230 is transmitted to the edge of the substrate 215 through the pressing surface 238a of the pressing part 238, even when the gross weight of the edge ring 230 is minimized, high pressure can be applied to the edge of the substrate 215. This is because pressure is inversely proportional to contact area.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a memory device having a 3-dimensional structure, the method comprising:
   alternately stacking one or more dielectric layers and one or more sacrificial layers on a substrate;
   forming a through hole passing through the dielectric layers and the sacrificial layers;
   forming a pattern filling the through hole;
   forming an opening passing through the dielectric layers and the sacrificial layers; and
   supplying an etchant through the opening to remove the sacrificial layers, the etchant comprising at least one selected from the group consisting of $H_3PO_4$, HF, and a buffered oxide etchant (BOE),
   wherein the stacking of the dielectric layers includes supplying the substrate with one or more first gases selected from the group consisting of ethyl-based gas and methyl-based gas, and one or more second gases selected from the group consisting of $SiH_4$, $Si_2H_6$, $Si_3H_8$, and $Si_4H_{10}$, to deposit a silicon carbon oxide (SiCO) layer, and
   the stacking of the sacrificial layers includes supplying the substrate with one or more third gases selected from the group consisting of $SiH_4$, $Si_2H_6$, $Si_3H_8$, $Si_4H_{10}$ and dichloro silane ($SiCl_2H_2$), and ammonia-based gas, to deposit a silicon nitride layer, and
   wherein the sacrificial layer has an etch rate that is about 5 times to about 300 times greater than that of the dielectric layer.

2. The method of claim 1, wherein the dielectric layer and the sacrificial layer have an etch selectivity with respect to the etchant.

3. The method of claim 1, wherein the ammonia-based gas comprises $NH_3$.

4. The method of claim 1, wherein the substrate is maintained at a temperature ranging from about 300° C. to about 790° C. and a process pressure ranging from about 10 mTorr to about 250 Torr, during a process in which silane gas and a reaction gas are supplied in a chamber.

5. The method of claim 1, wherein the silicon carbon oxide (SiCO) layer and the silicon nitride layer are different in thickness.

6. The method of claim 1, wherein the alternately stacking of the dielectric layers and the sacrificial layers comprises pressing an edge of the substrate with an edge ring.

7. The method of claim 6, wherein the edge of the substrate has a width ranging from about 0.5 mm to about 3 mm inward from a boundary of the substrate.

8. The method of claim 6, wherein the edge ring is formed of ceramic.

9. A method of manufacturing a memory device having a 3-dimensional structure, the method comprising:
   alternately stacking one or more dielectric layers and one or more sacrificial layers on a substrate;
   forming a through hole passing through the dielectric layers and the sacrificial layers;
   forming a pattern filling the through hole;
   forming an opening passing through the dielectric layers and the sacrificial layers; and
   supplying an etchant through the opening to remove the sacrificial layers, the etchant comprising at least one selected from the group consisting of $H_3PO_4$, HF, and a buffered oxide etchant (BOE),
   wherein the stacking of the dielectric layers includes supplying the substrate with one or more first gases selected from the group consisting of ethyl-based gas and methyl-based gas, and one or more second gases selected from the group consisting of $SiH_4$, $Si_2H_6$, $Si_3H_8$, and $Si_4H_{10}$, to deposit a silicon carbon oxide (SiCO) layer, and
   the stacking of the sacrificial layers includes supplying the substrate with one or more third gases selected from the group consisting of $SiH_4$, $Si_2H_6$, $Si_3H_8$, $Si_4H_{10}$ and dichloro silane ($SiCl_2H_2$), ammonia-based gas, and one or more fourth gases selected from the group consisting of $B_2H_6$ and $PH_3$, to deposit a silicon nitride layer in which boron or phosphorus is implanted, and
   wherein the sacrificial layer has an etch rate that is about 5 times to about 300 times greater than that of the dielectric layer.

* * * * *